United States Patent
Akanabe et al.

(10) Patent No.: US 6,651,335 B2
(45) Date of Patent: Nov. 25, 2003

(54) METHOD OF PRODUCING AN INK JET PRINT HEAD THROUGH A PROCESSING METHOD OF ELECTROLESS PLATING

(75) Inventors: Yuichi Akanabe, Tokyo (JP); Shozo Kikugawa, Tokyo (JP); Tetsuo Okuno, Tokyo (JP); Minoru Yamada, Tokyo (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 09/965,028

(22) Filed: Sep. 27, 2001

(65) Prior Publication Data

US 2002/0047878 A1 Apr. 25, 2002

(30) Foreign Application Priority Data

Oct. 20, 2000 (JP) ......................... 2000-321173

(51) Int. Cl.$^7$ .................. H04R 17/00; B23D 53/76; B05D 3/06
(52) U.S. Cl. ............... 29/890.1; 29/25.35; 29/DIG. 12; 427/100; 427/98; 427/304; 427/555; 427/556; 347/68; 347/71; 219/121.69; 219/121.2
(58) Field of Search ............................ 29/890.1, 25.35, 29/846, 847, 852, DIG. 12; 427/100, 98, 125, 304, 305, 555, 556; 347/68, 71; 219/121.2, 121.69

(56) References Cited

U.S. PATENT DOCUMENTS

| | | | | |
|---|---|---|---|---|
| 4,486,463 A | * | 12/1984 | Rubner et al. | ............ 428/98 X |
| 4,960,613 A | * | 10/1990 | Cole et al. | ............ 427/555 X |
| 5,560,090 A | * | 10/1996 | Komakine et al. | ......... 29/25.35 |

FOREIGN PATENT DOCUMENTS

JP      4-56385     *    2/1992         427/98 X

OTHER PUBLICATIONS

Davis et al, "Thin Film Metallization of Three–Dimensional Substrates", Electronic Components and Technology Conference, 1994. Proceedings, 44th., INSPEC Accession No. 4874584, May 1994, pp. 359–361.*

* cited by examiner

Primary Examiner—A. Dexter Tugbang
(74) Attorney, Agent, or Firm—Frishauf, Holtz, Goodman & Chick, P.C.

(57) ABSTRACT

A processing method of electroless plating in which a catalyst layer is absorbed on a surface of a substrate, a laser beam is selectively applied to the catalyst layer, processing of electroless plating is applied to the substrate, thereby a plating layer is not formed on a part to which the laser beam has been applied, and a plating layer is formed on a part to which laser beam has not been applied.

9 Claims, 7 Drawing Sheets

BEFORE LASER RADIATION

AFTER LASER RADIATION

METHOD OF PRODUCING AN INK JET PRINT HEAD THROUGH A PROCESSING METHOD OF ELECTROLESS PLATING

BACKGROUND OF THE INVENTION

This invention relates to a processing method of resistless, maskless electroless, 3-dimensional plating of an ink-jet print head, and a production method thereof.

Electroless plating is depositing a continuous film of metal by controlling reduction and oxidation reaction which occurs between metallic salts and reducing agents in a plating bath. By electroless plating, a film of metal, alloy, compound, or composite can be formed onto an electrically non-conductive surface.

Eelectroless plating is capable of conducting metal deposition without electric power. But, before electroless plating, plating catalyst must be absorbed onto a substrate to initiate metal deposition. Otherwise, the electroless plating cannot start.

After starting, already deposited metal itself can work as a self catalyst for further plating.

An electroless plating can coat a metallic layer onto a non-conductive substrate which has previously been subjected to a suitable pre-processing, such as washing, etching and catalyst absorbing, and an uniform metallic film can be deposited on any substrates whatever shape they may have. Usual electroless plating metal is nickel, and can be deposited onto a various kind of substrates, including metal, plastic, ceramic, and other non-conductors. Because electroless plating is capable of depositing a metal layer onto any surface, regardless of their conductivity and even inside wall of a small hole, it is widely used in a electronic industry, for example, in a circuit patterning of a printed wiring board, contact point of a connector, a semiconductor device, a package of a ceramic-metal-integrated circuit, a connector shell made of aluminum, a lead frame, formation of an electrode of an ink-jet print head, etc.

In particular, regarding an ink-jet print head, it can be cited, a piezo type ink-jet print head which jets inks from an ink chamber by a piezo ceramic actuator, attached to an ink chamber, through the application of an electric signal to an electrode of a piezo ceramic. Further, there is another type of piezo ink-jet print head which is called share-mode print head.

The share mode print head have many minute ink channels inside a piezoelectric ceramic itself and metal is selectively deposited onto a partition wall between the channels as an electrode.

By applying an electric signal to electrodes between a wall, share-mode deformation of the partition wall occurs and compress the ink inside the channel and ejects a droplet from the channel.

Ink-jet print head have to eject a droplet from each channel independently. But electroless plating deposits a metal film onto a whole surface evenly, so either masking before plating or removing unnecessary metals after plating, is inevitable, to separate electrode and wiring, in each channel.

In a print head, we must build both electrode pattern to actuate piezo ceramic channel and wiring pattern to connect between electrode and control circuit, simultaneously by electroless plating. The Patterning technology is very important for an ink jet print head.

Usual patterning technology is as follows, coat of a photoresist is conducted onto a substrate and UV is irradiated through an appropriate mask. After developing a pattern image, metal is deposited, onto a portion which is not masked.

As for ink jet print head, head size is very small and has many minute ink channels, and also, 3-dimensional wiring is required. Recently, channel width is approaching less than 50 μm, and channel numbers are increasing over 500, and also, an electrode pattern must be built inside and a wiring pattern must be built outside of the channel, simultaneously by electroless plating. The usual patterning method using photoresist and mask is not adequate for ink jet print head due to its small size and a complex 3-dimensional structure.

Laser pattering is most suitable for ink jet print head. This is a resistless, maskless, 3-dimensional pattering.

Laser pattering technology of print head is described in the publications of Japanese Tokkaihei H8-300667 and H9-10976 and WO 00/29217. There is cited a method in which a pattering of an electrode and wiring is accomplished by evaporating a metal deposited in an unnecessary portion of a print head, by selective application of a high-energy laser beam.

As described in the patents, in the conventional technology, separation of an electrode and wiring is accomplished through evaporation of unnecessary metal film by a laser beam, but nickel is a very hard metal and has high melting temperature, therefore, high energy density laser beam is required, thus thermal shock and thermal distortion occur in the piezoelectric ceramic, the piezo-electrical properties is very sensitive to elevated temperature, and its performance is easily deteriorated by heat and also there is a possibility of damage in a print head.

Further, the high energy laser beam, requires a high-output and high-priced apparatus. Moreover, there is a possibility that the metallic film evaporated by high energy laser beam, have a tendency to redeposit around the surroundings, and may produce defects due to redeposited debris, in the final electrode and wiring, resulting in a short circuit.

SUMMARY OF THE INVENTION

This invention was performed in view of the above-mentioned actual situation, and its first object is to provide a processing method of a resistless, maskless and 3-dimensional electroless plating which is capable of forming a plating pattern having no defect at low cost without deteriorating both piezo-electrical and physical properties and further, without producing any damage in a head.

Its second object is to provide a new laser pattering method which evaporates plating catalyst, instead of plated metal. The former requires one-tenth energy of the latter, so undesirable heat shock, and debris formation can be minimized.

It can provide an ink-jet print head which has an electrode and wiring pattern, having no defect, at low cost without deteriorating both piezoelectric and physical properties and further, without producing any contamination due to debris in a head, and the method of manufacturing it.

Its third object is to provide a new UV pattering method which oxidize plating catalyst, instead of evaporation.

The former requires much lower energy, no undesirable heat shock, and no debris formation can be expected. It can provide an ink-jet print head which has an electrode and wiring pattern, having no defect, at low cost without deteriorating both piezoelectric and physical properties and further, without producing any damage in a head, and the method of manufacturing it.

For the purpose of solving the above-mentioned problems and accomplishing the objects, this invention was made to have any one of methods described in the following.

(Method 1): A processing method of electroless plating characterized in that a catalytic material for electroless plating is absorbed onto a surface of a piezo-electric ceramic, then a laser beam is selectively applied to this ceramic, finally, processing of electroless plating is applied to this ceramic, a metal layer is formed on the portion to which the laser beam has not been irradiated and a metal layer is not formed on the portion to which the laser beam has been irradiated.

To separate the electrode and wiring between channels, evaporating a catalyst, instead of metal, much lower laser power is needed, so much lower thermal damage and much lower debris can be expected. Because, the amount of catalytic material contained is only $\mu$g order palladium, but the amount of electrode material contained is mg order nickel.

According to the method 1, prior to electroless plating, the substrate with catalyst has already been selectively irradiated by laser beam, a plating pattern having no defect can be formed at a low cost without deteriorating the piezoelectric and physical properties and further, without producing any damage and contamination in a print head.

(Method 2): A processing method of electroless plating characterized in that a catalytic material is absorbed onto a surface of a substrate, a photochemical reaction is made to occur selectively in the catalyst, then, processing of electroless plating is applied to this substrate, a plating layer is formed on the portion in which the photochemical reaction has not occurred, and a plating layer is not formed on the portion in which the photochemical reaction has occurred. Plating catalyst, such as palladium, can be deactivated by oxidation with ultra violet beam, instead of evaporation.

According to the method 2, by carrying out processing of electroless plating on a substrate with catalytic material absorbed thereon in which a photochemical reaction has been made to occur selectively. Because requisite energy of oxidation is much smaller than evaporation, no thermal damage, no debris can be expected, and, also, UV beam is more easy to handle than laser beam. The plating pattern having no defect can be formed at a low cost without deteriorating the piezoelectric and physical properties and further, without producing any damage in a head.

(Method 3): The same process as the method 1 or 2, except during plating, the substrate is picked up from the plating bath as soon as a thin metallic layer emerges, and to remove the trace amount of residual catalyst from the substrate, the substrate is washed by water and/or chemical etched. After washing thoroughly by water. The substrate is put into the bath, again, to resume the plating. Because already deposited metal works as a catalyst, so plating can continue.

We noticed that plating thickness less than 5 $\mu$m, we can get a defect free pattern with method 1 or 2. But more than 5 $\mu$m, undesirable metal sometimes deposits due to the trace amount of residual catalyst.

According to the method 3, by stopping the plating at the timing when a thin metallic layer has deposited and removing the residual catalytic material by washing and/or chemical etching, as the remaining catalyst is thoroughly eliminated, formation of a plating layer by deposition is suppressed completely, even after plating process is resumed. But, in the portion where a plating layer has already been formed, the plating layer itself act as catalyzer, plating continues and thick plating layer, more than 5 $\mu$m, can be formed.

A method of manufacturing an ink-jet print head as set forth in the method 1, characterized in that the aforesaid laser beam is a pulse oscillation laser beam.

Aforesaid laser use a pulse oscillation laser beam, and by applying a light beam with a high energy density for a short time, it is possible to limit a thermal influence produced by the irradiation within a very narrow range.

A method of manufacturing an ink-jet print head as set forth in the method 1, characterized in that the irradiation by the aforesaid pulse oscillation laser beam is repeated two times or more on the same place.

In the case where a part remains to which the action of the laser pulse has not been given by an irradiation of only one time, the repeating of irradiation makes the action of the laser pulse certainly effective.

A method of manufacturing an ink-jet print head as set forth in the method 1, characterized in that the aforesaid pulse oscillation laser beam is a Q-switched laser beam.

According to the method 1, it uses a Q-switched laser beam, and because the Q-switched laser beam has a higher peak value and a narrower pulse width, in the case where a part remains to which the action of the laser pulse has not been given by an irradiation of one time, the action of the laser pulse can be made certainly effective by repeating irradiation; further, the action of the laser beam acts only on the outer layer portion, and the heat diffusion to the surrounding becomes less; therefore, it is possible to suppress the thermal influence and damage by the laser beam to a minimum limit.

A method of manufacturing an ink-jet print head as set forth in the method 1, characterized in that the aforesaid pulse oscillation laser beam is a Nd:YAG laser beam.

According to the method 1, by using a Nd:YAG laser beam, the laser device is made small-sized and has a high efficiency, and the convergence of the beam is good; therefore, it is very suitable.

A method of manufacturing an ink-jet print head as set forth in the method 1, characterized in that the aforesaid pulse oscillation laser beam is the second harmonic of a Nd:YAG laser.

According to the method 1, by making the pulse oscillation laser beam the second harmonic of a Nd:YAG laser, the wavelength is 532 nm, which is a half of, and shorter as compared to the wavelength of the basic wave 1.06 Mm, the convergence of the beam is better as compared to the basic wave, and it is a visible beam; therefore, it is easy to adjust the position of the irradiation by the laser beam to a minute portion, and also it is easy to do it exactly.

A method of manufacturing an ink-jet print head as set forth in the method 1, characterized in that the aforesaid pulse oscillation laser beam is the third harmonic of a Nd:YAG laser.

According to the method 1, by making the pulse oscillation laser beam the third harmonic of a Nd:YAG laser, although it is disadvantageous as compared to the second harmonic of a Nd:YAG laser in the sense that it is invisible because it is an ultraviolet ray, the convergence of the beam is better than the second harmonic owing to the wavelength being shorter, and generally speaking, it can be expected that the absorption ratio by a piezoelectric substance is higher than the second harmonic.

A method of manufacturing an ink-jet print head as set forth in the method 2, characterized in that, in the aforesaid processing of electroless plating, ultra violet beam is available, instead of laser beam. Although UV has less power than laser, UV is used to oxidize the catalytic material instead of evaporation. To make a thin metallic patterns, for example less than 1 µm, UV is available and gives a satisfactory results. UV has no thermal damage and make no debris and also UV is more easy to handle, and less expensive than laser.

A method of manufacturing an ink-jet print head as set forth in the method 3, characterized in that, in the aforesaid processing of electroless plating, deposition process in plating is divided into a plurality of stages, and a residual catalytic material in the portion where electrode is not formed, is removed by water washing and/or chemical etching in an intermediate process between the stages.

According to the method 3, in order to prevent that, in the case where the catalytic material is not completely removed, if plating is continued for a long time to obtain a sufficient film thickness of plating, for example more than 5 µm, sometimes a plating layer by deposition is also formed on a portion to which a laser beam has been applied, plating is once stopped at the timing when a thin plating layer by deposition, less than 1 µm, is formed on a portion where no laser beam has been applied, and the catalytic material is removed again, by water washing and/or chemical etching. As residual catalytic material on the laser-irradiated portion has been removed thoroughly, formation of a plating layer by deposition is suppressed completely, even after plating is resumed. Nickel can work as a catalyst, so, in the non-irradiated portion, on which formation of a Ni plating layer has already been made, continues to grow without a catalyst.

A sufficiently thick plating layer, more than 5 µm, can be formed.

DETAILED DESCRIPTION OF THE PREFERRED EMBODIMENT

In the following, examples of the embodiment of a processing method of electroless plating, an ink-jet print head, and a method of manufacturing it of this invention will be detailed on the basis of the drawings. As for the processing method of electroless plating of this invention, it will be explained about an ink-jet print head taken for instance.

Further, as for the ink-jet print head, there are such one that jets ink by the application of an electric voltage to an electrode for driving the piezo-electric actuator, such one that jets ink from a channel formed of a member including a piezoelectric ceramic by the application of an electric voltage to an electrode for driving the piezoelectric ceramic, etc.; in this embodiment, an ink-jet print head which jets ink drops from ink channels is shown, but this invention is not to be limited to this.

Figure 1:
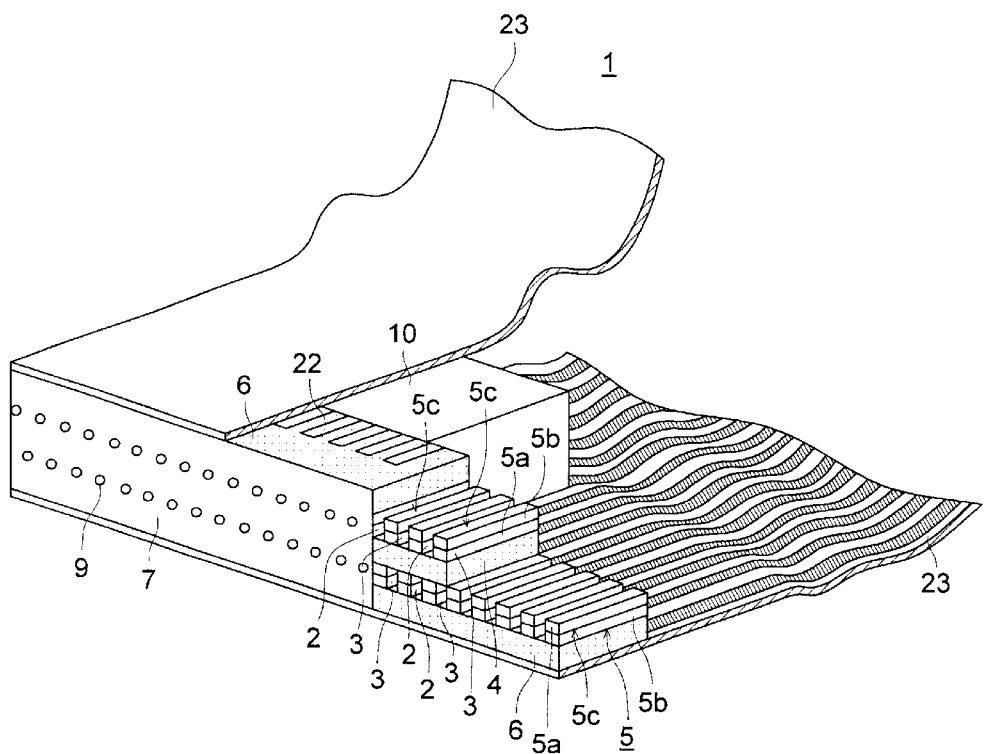
FIG. 1 is an exploded view showing a part of an ink-jet print head.
Figure 2:
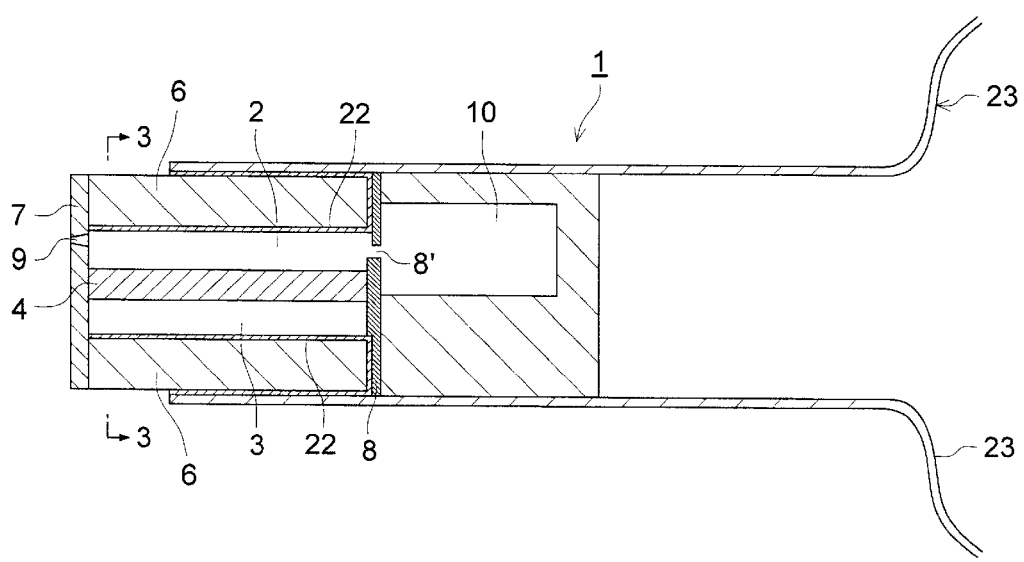
FIG. 2 is a cross-sectional view of an ink-jet head.
Figure 3:
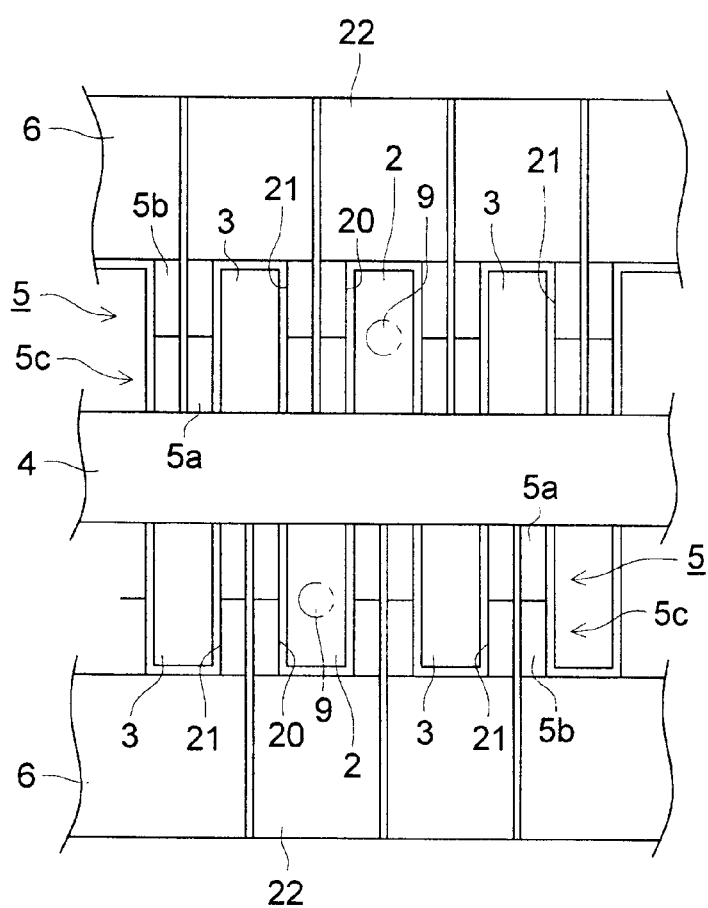
FIG. 3 is the cross-sectional view at the 3—3 line in FIG. 2.

FIG. 1 and FIG. 2 show an ink-jet print head; FIG. 1 is an exploded view showing a part of an ink-jet print head, and FIG. 2 is a cross-sectional view of an ink-jet print head, and FIG. 3 is the cross-sectional view at the line 3—3 in FIG. 2.

In the ink-jet print head 1, there are provided ink channels 2 and channels 3 which are positioned at the both sides of the ink channels 2. The ink channels 2 and the channels 3 are formed of piezoelectric ceramic 5 disposed at the both sides of a common base plate 4, base plates 6 bonded to the piezoelectric plates 5 respectively, a nozzle plate 7 and an ink supply plate 8 are positioned at both ends respectively.

In the nozzle plate 7, nozzle holes 9 are formed at the positions corresponding to the ink channels 2, and in the ink supply plate 8, ink supply holes 8' are formed at the position corresponding to the ink channels 2, and manifold 10 is attached to the backside of the print head. Ink is supplied from the manifold to the ink channels 2, through the ink supply hole 8' by driving the piezoelectric substrates and is jetted from the nozzle holes 9.

For the piezoelectric ceramic 5, for example, a soft type PZT is used. For the channels 3, either a structure in which ink is made to flow into them or a structure in which ink does not flow into them may be employed, but in this embodiment, an example in which ink does not made to flow, will be explained, that is, both sides of the channels 3 are closed. In the case of a structure in which ink is made to flow into the channels 3, the channels 3 are equivalent to the ink channels 2.

The piezoelectric substrate 5 is composed of a substrate 5a and a substrate 5b bonded to each other with their directions of polarization reversed to each other. On each of partition walls 5c between the ink channels 2 and the channels 3, electrodes 20 and 21 are provided.

On each of the base plates 6, an electrode wiring 22 is provided, which is connected to the electrodes 20 and 21. Further, the electrode wiring 22 forms a three-dimensional wiring, and is connected to a flexible printed circuit 23.

Ink is jetted from the nozzle holes 9 by it that ink is made to flow into the ink channels 2 from the manifold 10 through the ink supply hole 8', an electric voltage from the electrodes 20 of the ink channels 2 toward the electrodes 21 of the channels 3 is applied by applying an electric voltage to the electrodes 20 and grounding the electrodes 21, and the partition walls 5c are made share-mode deformation.

In the ink-jet print head 1 of this invention, which has the ink channels 2 and the channels 3 parallel to each other formed in the piezoelectric substrates 5 of polarized PZT (lead zirconate titanate), by applying an electric field through the partition walls 5c between the electrodes 20 which are formed on the partition walls 5c of the ink channels 2 and the electrodes 21 which are formed on the partition walls to the neighboring channels 3, the partition walls 5c are made share-mode deformation to apply a pressure to a ink, and it is jetted.

Because jetting is done by the share-mode deformation of the partition walls of each of the ink channels 2, if a droplet is ejected from a channel, the ink in the neighboring channels is made to be vibrated, which makes it impossible to jet ink from neighboring two ink channels 2, simultaneously. In order to prevent this effects, it is desirable that the channels 3 in which ink does not flow are provided between each neighboring pair of the ink channels 2. That is to say, making ink channel and air channel, alternately.

However, also it is appropriate that ink is made to flow into all of the channels, and a pressure is applied alternately to channels of even numbers and to channels of odd numbers at the time of ink-jetting, to jet ink from every two channels, which prevents cross talk. Further, the effect of preventing cross talk is made more remarkable by applying pressure to every three channels.

As for the piezoelectric substrates 5, the piezoelectric material is a ceramics, producing an electrical to mechanical conversion by the application of an electric voltage. For such a material, any one known to the public can be used, and a substrate made of an organic material, a piezoelectric substrate of an inorganic material composed of metallic oxides can be cited. In particular, a piezoelectric substrate made of an inorganic material is desirable, and for such a substrate, a piezoelectric substrate formed through processes of molding, firing and sintering, etc, a substrate formed without necessity for molding, firing and sintering, etc. can be cited.

For an organic material for this substrate, an organic polymer such as a polyvinyliden-fluoride, a hybrid material of an organic polymer and an inorganic material, etc. can be cited.

For a piezoelectric ceramic substrate which is formed through processes of molding, firing and sintering, etc., lead zirconate titanate (trade name: PZT) is desirable.

As for the PZT, there are a PZT ($PbZrO_3$-$PbTiO_3$) and a PZT with a third component added. For the third component to be added, $Pb(Mg_{1/3}Nb_{2/3})O_3$, $Pb(Mn_{1/3}Sb_{2/3})O_3$, $Pb(Co_{1/3}Nb_{2/3})O_3$, etc. can be cited, and also it is appropriate to use $BaTiO_3$, $ZnO$, $LiNbO_3$, $LiTaO_3$, etc.

Further, for a substrate which is formed without the necessity for molding, firing and sintering, for example, one that is formed by a sol-gel method, a laminated substrate coating method, etc. can be cited. According to a sol-gel method, a sol is prepared by it that water, an acid, or an alkali is added to a homogeneous solution having a specified chemical component, to cause a chemical change such as a hydrolysis to occur. Further, by applying a treatment such as evaporation of the solution, cooling etc. a sol, in which fine particles having an aimed composition or the precursors of non-metallic inorganic fine particles are dispersed, is prepared, and from this, a substrate can be produced. A compound with a uniform chemical composition including also a little amount of additives of other elements can be obtained. For the starting material, a water-soluble metallic salt or metal alkoxide such as sodium silicate is generally used; a metal alkoxide is a compound expressed by a general formula $M(OR)_n$, is easily hydrolyzed because the OR radical has a strong alkaline property, and is changed to a metal oxide or its hydrate through a condensation process as an organic high molecular compound.

Further, for a method of coating a laminated substrate, there is a vapor deposition method in which a deposition layer is formed by precipitation from vapor phase; a method of preparing a ceramic substrate from vapor phase is classified into a vapor deposition method by physical means and a chemical precipitation method in which a layer is formed by precipitation onto the surface of a substrate from vapor phase by chemical reaction. Further, the physical vapor deposition method (PVD) is divided into a vacuum evaporation method, a sputtering method, an ion plating method, etc., and the chemical method includes a chemical vapor deposition method (CVD), a plasma CVD method, etc. The vacuum evaporation method as a physical vapor deposition (PVD) method is a method in which a substance of the object is heated in vacuum to be evaporated, and the vapor is made to attach on a substrate, and the sputtering method is a method utilizing the sputtering phenomenon in which high-energy particles are made to collide with a target substance, and atoms and molecules on the target surface exchange momentum with the collision particles, to be sprung out from the surface. Further, the ion plating method is a method in which deposition by evaporation is carried out in an ionized gas environment. Further, in the CVD method, a compound including atoms, molecules, or ions which are supposed to compose a film is brought into a state of vapor phase, are introduced into a reaction part by a suitable carrier gas, and are made to react or react to precipitate with a heated substrate to form a film, and in the plasma CVD method, a state of vapor phase is generated by plasma energy, and a film is made to precipitate by a chemical reaction in a comparatively lower temperature range of 400° C. to 500° C.

Further, for a material of the base plates 6, it is desirable to use the same material as the piezoelectric substrates 5, because, as the same materials are bonded to each other, exfoliation during bending, deformation and temperature change, due to the difference in thermal expansion coefficient, does not occurs. Further, piezo-electric ceramic is very expensive, so, the base plates 6, made of a non-piezoelectric ceramic material having the same thermal expansion coefficient as the piezoelectric substrates 5, is desirable. Further, the base plates 6 may be integrally built with the substrates 5.

The material for the common base plate 4 and the base plates 6 is not particularly limited; it may be a base plate made of an organic material, or may be a base plate made of a non-piezoelectric ceramic material. For a non-piezo electric ceramic, it is desirable to select at least one, out of alumina, aluminum nitride, zirconia, silicon, silicon nitride, silicon carbide, quartz, etc.

For a non-piezo electric base plate, for example, a ceramic base plate formed through processes such as molding, firing and sintering, a base plate formed without the necessity for molding, firing and sintering, etc. can be cited; for the ceramic base plate formed through processes such as molding, firing and sintering, for example, $Al_2O_3$, $SiO_2$, mixture or fused mixture of these, $ZrO_2$, BeO, AlN, SiC, etc. can be used. For an organic material, an organic polymer such as a polyether imide, polyether polysulfon, a hybrid material of an organic polymer and an inorganic substance, etc. can be cited.

Next, a method of manufacturing the ink-jet print head will be explained on the basis of FIG. 4(a) to FIG. 4(i).

Figure 4:
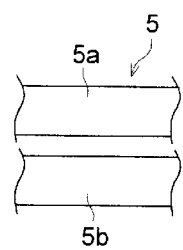
FIG. 4(a) to FIG. 4(i) are drawings illustrating a method of manufacturing an ink-jet print head.
Figure 4:
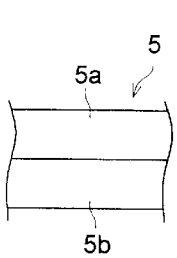
Figure 4:
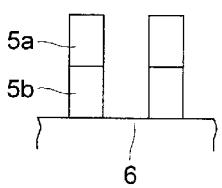
Figure 4:
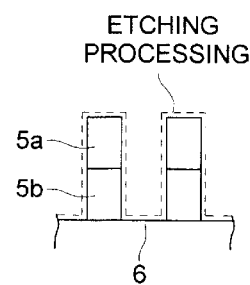
Figure 4:
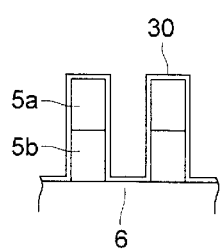
Figure 4:
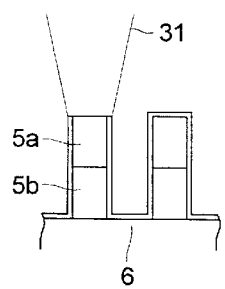
Figure 4:
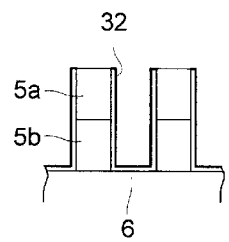
Figure 4:
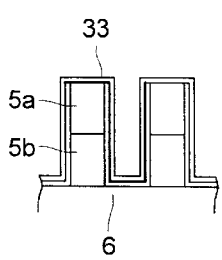
Figure 4:
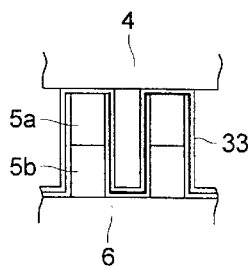

First, the substrate 5a made of a piezoelectric ceramics and the substrate 5b made of the same material are cleaned by a cleaning water composed of pure water with a surfactant added (FIG. 4(a)), and are bonded to each other with their directions of polarization reversed to each other, to build the composite piezoelectric substrate 5 (FIG. 4(b)). Subsequently, from the side 5a to the side of the substrate 5b which is bonded to the base plate 6, the ink channels 2 and the channels 3 are alternately formed by grinding (FIG. 4(c)). The bonded member composed of the substrate 5 having the ink channels 2 and the channels 3 formed and the base plate 4 is cleaned by a cleaning water composed of pure water with a surfactant added.

This bonded member is dipped into a aqueous solution of acidic ammonium fluoride, hydrogen fluoride acid or hydrogen borofluoric acid etc with 0.5 to 1.1% concentration, and the grain boundary of PZT is etched (FIG. 4(d)). Next, stannous chloride ($SnCl_2$) and palladium chloride ($PdCl_2$) are adsorbed, to generate metallic palladium $Pd^0$, which becomes a catalyst 30 of electroless plating, by the reaction, $SnCl_2 + Pdcl_2$ R $Pd^0 + SnCl_4$ (FIG. 4(e)).

A laser beam 31 is selectively applied to the top of the wall, to evaporate catalyst 30 (FIG. 4(f)). Then, this substrate is dipped into an electroless Ni plating bath, and at 60° C., Ni—B(0.7%) deposits, or at 80° C., Ni—P deposits. In some cases, Ni—B deposits, and subsequently Ni—P deposits. By doing this, a metal layer 32 of 3–5μ thickness is formed as electrode (FIG. 4(g)). After that, onto the formed metal layer 32, a protective layer 33 of an organic insulating film is formed by electro deposition (FIG. 4(h)). Finally, to close the channel, cover plate 4 is bonded.(FIG. 4(i)).

In other way, also it is appropriate that Ni—B is made to deposit on PZT, and also, Ni—P is made to deposit onto Ni—B. Because, Ni—B has low electric resistance but low resistance to an environmental corrosion. On the other hand, Ni—P has high electric resistance but high corrosion resistance.

It is desirable that the content of B is not greater than 1%, and the content of P falls within a range from 1% to 8%, in view of electrical resistance and film properties.

If the electrode contacts with ink directly, electro-decomposition of ink occurs on the electrode surface, which produce large amount of hydrogen gas bubbles and also electrode itself dissolves. In order to prevent this problem, electrode must be protected by an insulating layer.

As for a insulating material for ink jet print head, both inorganic and organic materials are preferable, for example, silicone nitride and epoxy resin etc. Above all, electro deposition resin is most preferable. Because, by electro deposition, only conductive surface can be coated by insulating resin. Regarding electro deposition, an anionic electro deposition resin of an acrylic polymer, a copolymer of acrylic acid, methylmethacrylate, buthylacrylate, 2-hydroxiethylacrylate, etc. are neutralized by amine, to be dissolved in water, and a melamine hardening agent is added; then, a direct current electric voltage of 30 V is applied between the Ni-plated head as an anode and a stainless steel plate as a cathode for 1 minute. In this case, an insulating organic film having a thickness of 3 Mm deposits on the Ni-plated portion.

The film thickness is controlled by this applied electric voltage and the voltage application time. Then, after preliminary drying at 100° C., the film is hardened at 180° C. for 15 minutes. In other way, it is also appropriate that a resin material including a polyfunctional acrylate is deposited by electro deposition and is hardened by ultraviolet rays, without thermal damage.

Because electro deposition exhibits a good coatability even on the surface having minute recesses, organic film precipitates uniformly along on the roughness of the substrate. Further, on top of it, because resin is melted at the time of hardening, the evenness of the film thickness is made better by it.

For the contact angle of water on the hardened insulating organic film, less than 60 degrees is desirable. If water contact angle exceed 60 degrees, it is not easy for ink to enter the channel smoothly from the manifold, and adhered bubbles on the manifold wall are difficult to be removed.

Then, the two piezoelectric substrates 5 are connected to the common base plate 4 with their channel position shifted by a half pitch to each other, the nozzle plate 7 and the ink supplying member 8 are connected to the both ends respectively, and the flexible wiring cable 23 is connected to the wiring. (FIG. 2).

Figure 5:
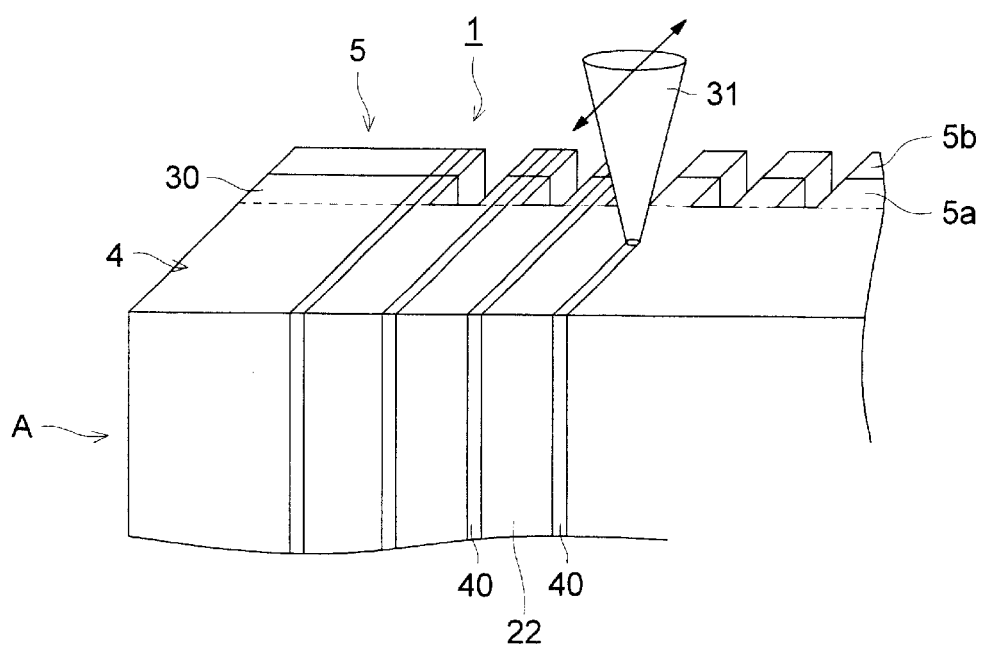
FIG. 5 is a drawing illustrating formation of independent electrode inside a channel and independent wiring outside a channel, by the application of a laser beam and formation of a protective film on the metal.
Figure 6:
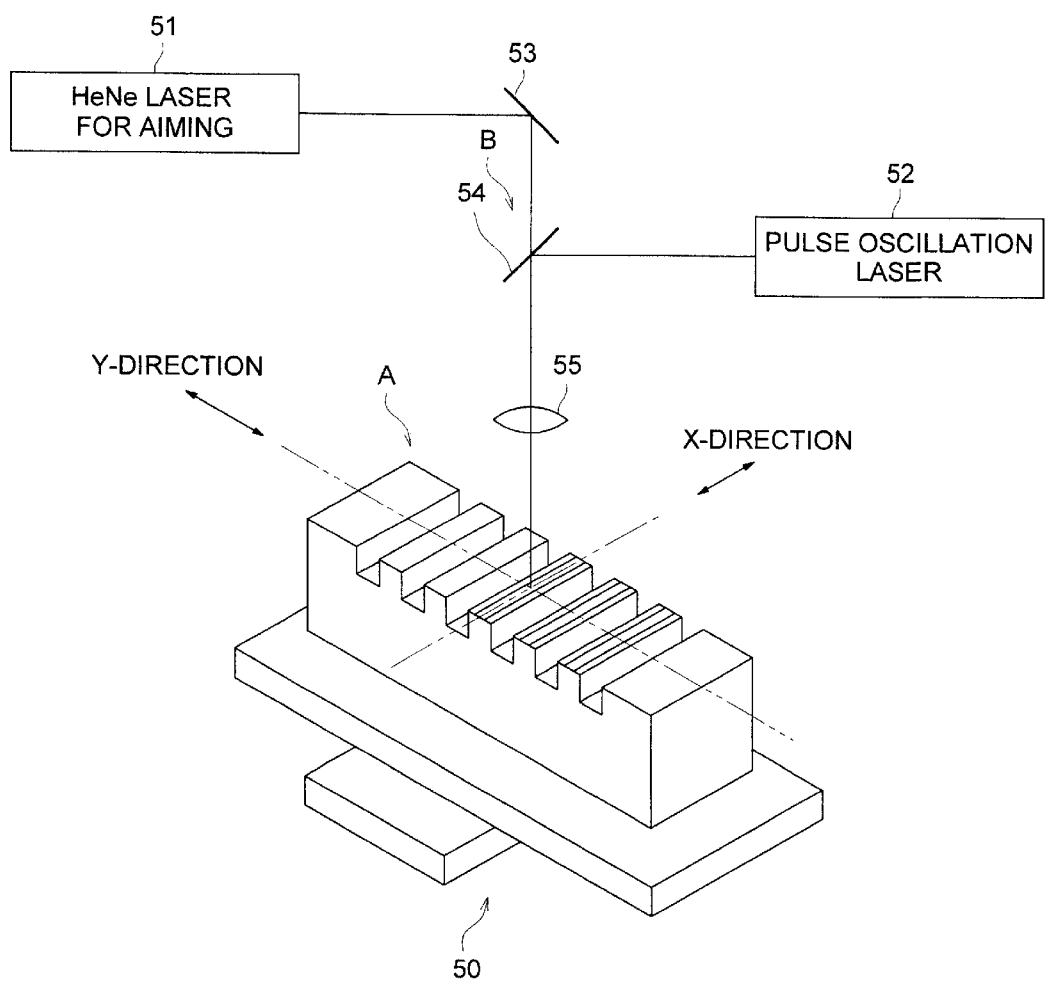
FIG. 6 is a perspective view of a laser beam applying apparatus.
Figure 7A:
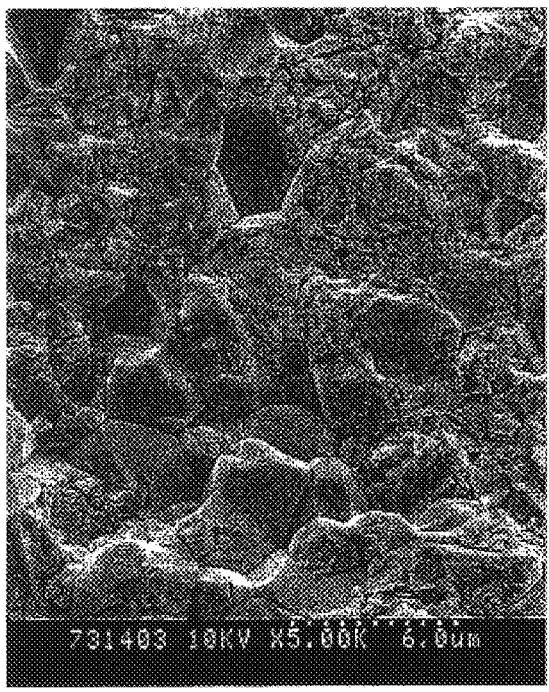
FIG. 7(a) and FIG. 7(b) are drawings showing how a surface is changed by laser beam radiation. Due to the thermal effect of laser beam, ceramic surface is melted and catalyst is evaporated.
Figure 7B:
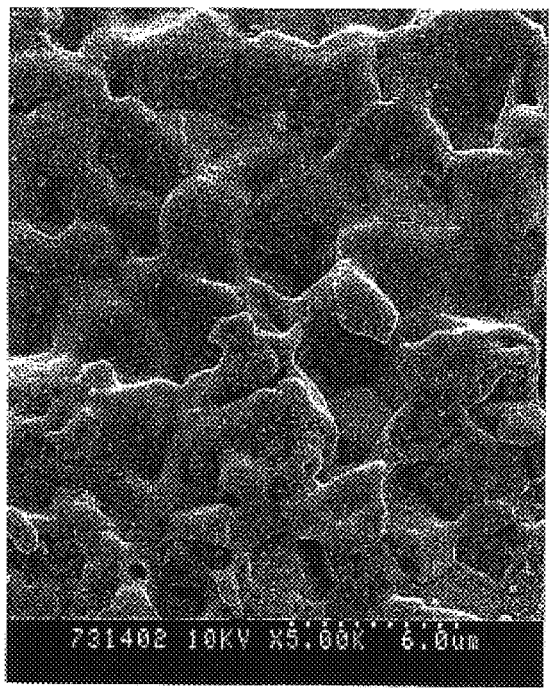

In the following, the processing of electroless plating of an ink-jet head of this invention will be explained on the basis of FIG. 5 to FIG. 7(b). FIG. 5 is a drawing illustrating how the independent electrode and wiring to each channel is made by the application of a laser beam. FIG. 6 is a perspective view of a laser beam applying apparatus, and FIG. 7(a) and FIG. 7(b) are drawings showing how a surface is changed by laser beam radiation. FIG. 7(b) shows that ceramic surface is melted and catalytic material is evaporated.

Catalyst 30 is absorbed on the whole surface of the print head. In order to make an independent electrode and an independent wiring to each ink channel, the laser beam 31 is selectively irradiated to a top portion of channel wall and also some part of side and rear wall of the print head, to remove the catalyst 30; then, this substrate is subjected to a processing of electroless plating, so, a plating layer is not formed on the part 40 from which the catalyst 30 has already been removed by the application of the laser beam 31, and independent electrode and wiring is formed on the part which has not been irradiated by the laser beam 31. An insulating protective film is formed onto electrode and wiring pattern by an electro deposition method.

Regarding the application of the laser beam 31, as shown in FIG. 6, the base member A, which has been treated with the catalyst is placed on an XY table 50, is made to be capable of moving in the X direction and Y direction, and by using a He—Ne laser 51 for reference and a pulse oscillation laser 52, the laser beam 31 is selectively applied to the thin catalyst layer absorbed on the surface of the base member A through mirrors 53 and 54 and a convergent lens 55.

By the application of this laser beam 31, as shown in FIG. 7(a) and FIG. 7(b), it can be observed by using an scanning electron microscope that the surface of the base member A is melted by the laser beam radiation, and catalyst is evaporated. By applying processing of electroless plating to this base member A, a plating pattern having no defect can be formed at a low cost without varying the piezo electrical and physical properties and further, without producing a damage.

The action of the laser beam 31 to the catalyst is such one that the surface layer portion coated with the catalyst is removed by the laser beam radiation. That is, the surface layer coated with the catalyst is melted by the laser beam radiation, and further, is removed by evaporation; because the catalyst exists in the surface layer and its thickness is extremely small, less energy density is enough than that for removing plating layer having usually a thickness of 2 mm or so.

Further, the action of the laser beam to the catalyst is also such one that the surface layer portion coated with the catalyst is melted by the laser beam radiation, and the catalyst flows from the surface portion and enters the inner portion, to lower the effect of the catalyst.

Further, the action of the laser beam to the catalyst is also such one that the surface layer portion coated with the catalyst is melted by the laser beam radiation and the catalyst in the concave portion of the surface layer roughness is covered with the melted material, to lower the effect of the catalyst.

Further, the thin catalyst layer 30 is absorbed on the surface of the base member A, and by making photochemical reaction, that is to say, oxidation, occurs selectively in this catalyst layer 30, the surface of the base member A can be changed. Processing of electroless plating is applied to this base member A; then, a plating layer is not formed on the part in which photochemical reaction has occurred, and it is formed on the part in which photochemical reaction has not occurred.

By making photochemical reaction occur selectively in the catalyst layer absorbed on the surface of the base member A, and applying processing of electroless plating to this base member, a plating pattern having no defect can be formed at a low cost without changing the piezo electrical and physical properties and further, without producing a damage.

As described in the above, in an example of the embodiment in which the action of a catalyst is lowered by a photochemical reaction, it is desirable that the action of a catalyst is lowered by a reaction brought about by ultraviolet rays as described in the following example. For example, an etched base member is made to adsorb stannous chloride on its surface, and the parts not to be plated are irradiated by ultraviolet rays having an wavelength of about 260 nm, which oxidizes stannous chloride $SnCl_2$ to stannic chloride $SnCl_4$ to make it inactive; then, it is made to adsorb palladium chloride $PdCl_2$, metallic palladium (Pd0) catalyst is generated on the parts to be plated, and electroless plating is done.

In processing of electroless plating, by dividing the deposition process of plating into a plurality of stages, and removing the residual catalytic material in the parts on which no plating layer has been formed yet by water washing and/or chemical etching, the catalyst layer in the parts on which no plating layer has been formed yet is sufficiently removed, and even after plating is resumed, formation of a plating layer by deposition is suppressed; on the other hand, in the parts on which a plating layer by deposition has already been formed, because the plating layer itself act as catalyst, the plating continues to grow without the catalyst, a sufficiently thick plating layer can be formed.

By using the pulse oscillation laser 52 for the laser beam 31, it is possible to limit the thermal influence produced by the laser beam radiation to a narrow range owing to it that a light beam of high energy density is applied for a short time.

In respect of the pulse oscillation laser 52, the same place is irradiated two times or more repeatedly; therefore, it is possible to make certain the effect of the action of the laser beam pulse by repeating the application of the laser beam, in the case where it remains a part to which the action of the laser beam has not been given as long as the irradiation is done only once.

For the pulse oscillation laser 52, a Q-switched laser can be employed; because the peak value is higher and the pulse width is narrower, in the case where it remains a part to which the action of the laser beam pulse can not be exerted as long as the irradiation is made only once, it is possible to cause the action of the laser beam pulse to have a more certain effect by repeating the application of the laser beam; it is possible to suppress the thermal influence and the damage by the laser beam to a minimum limit, because the action of the laser beam is given only to the surface layer portion, and diffusion of heat to the surrounding becomes less.

Further, it is very suitable to employ a Nd:YAG laser for the pulse oscillation laser 52, because it has a small size and a good efficiency, and the convergence of the beam is good.

Further, by utilizing the second harmonic of the Nd:YAG laser, the wavelength is 532 nm, which is a half of, and shorter as compared to the wavelength of the basic wave 1.06 mm, the convergence of the beam is better as compared to the basic wave, and it is a visible beam; therefore, it is easy to adjust the position of the laser beam radiation to a minute portion, and also it is easy to do it exactly.

Further, the third harmonic of a Nd:YAG laser can be also used; although it is disadvantageous as compared to the second harmonic of a Nd:YAG laser in the sense that it is invisible because it is an ultraviolet ray, the convergence of the beam is better than the second harmonic owing to the shorter wavelength, and generally speaking, the absorption ratio by a piezoelectric substance is higher than the second harmonic.

Next, a laser for use in this invention will be explained. For a laser to be used in this invention, a continuous oscillation laser (CW laser: Continuous Wavelength laser) can be cited; it outputs optical energy continuously as a fluorescent lamp or a tungsten lamp.

The unit of its output is given by the energy of light (including infrared rays and ultraviolet rays) outputted per unit time, usually expressed by watts (W). KW, mW, $\mu$W, etc. are also used in accordance with its level.

For a laser mainly used in continuous oscillation mode, a semiconductor laser, He Ne laser, Ar ion laser, carbon dioxide gas laser, etc. can be cited.

Further, a pulse oscillation laser can be also used; it emits optical energy only for a short time as a flash of a camera. The unit of its output is usually given by the energy of one pulse. In the case where pulse oscillation is done repeatedly, some times it is given by an average output.

For a laser which is mainly used in pulse oscillation mode, a YAG laser (1064 nm) and a glass laser (1064 nm) can be cited; a YAG laser is also called a Nd:YAG laser, and a glass laser is also called a Nd: glass laser. The atom that makes laser oscillation is Nd (neodymium), and YAG crystal or glass doped with Nd is used as a laser material.

Further, for a laser which is used in pulse oscillation mode, a ruby laser (694 nm) and an excimer laser (248 nm, etc.) can be cited. A YAG laser is used often in continuous oscillation mode.

Further, a Q-switched laser is used as a pulse oscillation laser; Q-switched laser is such one that a device to control the Q-value of resonance (a reciprocal of the loss during going and returning once in the resonator; the larger it is, the smaller loss is) is disposed in the resonator of the laser. Normally it keeps a state of a small Q-value, that is, a large loss, and when excited, it controls laser oscillation and switches the Q-value from small to large in a short time from the state where energy is stored. By doing this way, as compared to the continuous oscillation or usual pulse oscillation, a laser output having a higher peak value and a narrower pulse width can be obtained.

As a Q-switching device, a general one is an acousto-optic Q-switch; by propagating an ultrasonic wave in a medium to be Q-switched, a diffraction grating is formed in the medium, and a part of the light moving back and forth in the resonator is diffracted, to result in a loss. When the ultrasonic wave is stopped in that state, the Q-value gets large immediately, and a pulse output having a high peak value can be obtained.

In this invention, higher harmonics oscillation is induced in a laser; higher harmonics oscillation makes it possible to make the frequency of light (=light velocity/wavelength)

twice, that is, to make the wavelength a half by utilizing an advantage of high power density of a laser and using a non-linear crystal; therefore, it has various kinds of merits. Further, to use the third harmonic or the forth harmonic is also possible.

For example, a YAG laser oscillates at 1064 nm, which lies in the near infrared region; in this case, 1064 nm is called the wavelength of the basic wave.

The basic wave has a wavelength of 1064 nm, and because the original laser beam is used as it is, energy efficiency is high, that is, a high output is easily obtained. The wavelength of the second harmonic is 532 nm, and it is easy to make the converged beam diameter small in proportion to the wavelength. The wavelength of the third harmonic is 355 nm, and it is easier than the second harmonic to make the converged beam diameter small.

In this invention, it is desirable to use a YAG laser in the following way. For the method of excitation, continuous excitation by a high-output lamp is done, to actualize a high-speed repeated Q-switching about 10 KHz. In pulse-wise excitation by a flash lamp, although the energy of one pulse is large, the repetition is in the order of several tens of pulses pre sec.

To state the type of Q-switching, it is acousto-optic Q-switching, and is a high-speed repeated Q-switching.

As an actual apparatus, Y70-532Q of Spectra Physics co. is used; the wavelength of the laser is 532 nm, the pulse output is 0.6 mJ/pulse, the average output is 6 W at a repetition frequency of 10 KHz.

As explained up to now, in this invention, a plating pattern having no defect can be formed at a low cost without changing the piezo electrical and physical properties of the base member, and further, without producing a damage.

What is claimed is:

1. A method for producing an ink-jet print head in which ink is jetted from an ink channel by applying an electric voltage to an electrode and a wiring thereof for use in driving a piezoelectric body, the method comprising the steps of:

(a) forming the ink channel by a member including the piezoelectric body;

(b) absorbing an activated catalyst layer on an entire surface of the piezoelectric body;

(c) selectively radiating a laser beam to the catalyst layer to remove a selectively radiated portion of the catalyst layer; and (d) electroless-plating on the piezoelectric body, thereby not forming the electrode and the wiring on a portion of the piezoelectric body to which the laser beam has selectively radiated, and forming the electrode and the wiring on a portion to which the laser beam has not radiated.

2. The method of claim 1, wherein the laser beam is a pulse oscillation laser beam.

3. The method of claim 2, wherein the pulse oscillation laser beam radiates two times or more repeatedly a same portion of the piezoelectric body.

4. The method of claim 2, wherein the pulse oscillation laser beam is a Q-switched laser beam.

5. The method of claim 2, wherein the pulse oscillation laser beam is a Nd:YAG laser beam.

6. The method of claim 2, wherein the pulse oscillation laser beam is a second higher harmonics of the Nd:YAG laser.

7. The method of claim 2, wherein the pulse oscillation laser beam is a third higher harmonics of the Nd:YAG laser.

8. The method of claim 1, wherein the step of the electroless-plating comprises a plurality of electroless-plating stages, each stage comprising the step of removing the residual catalyst layer on a part of the piezoelectric body in which the electrode and the wiring have not been formed, by washing or chemical etching.

9. A method for producing an ink-jet print head in which ink is jetted from an ink channel by applying an electric voltage to an electrode and a wiring thereof for use in driving a piezoelectric body, the method comprising the steps of:

(a) forming the ink channel by a member including the piezoelectric body;

(b) absorbing an activated catalyst layer on an entire surface of the piezoelectric body;

(c) selectively making a photochemical reaction to occur in the catalyst layer to inactivate a selectively photochemical reacted portion of the catalyst layer; and (d) electroless-plating on the piezoelectric body, thereby not forming the electrode and the wiring on a portion of the piezoelectric body where the photochemical reaction has selectively occurred, and forming the electrode and the lead wiring on a portion where the photochemical reaction has not occurred.

* * * * *